(12) United States Patent
Chen

(10) Patent No.: US 8,003,457 B2
(45) Date of Patent: Aug. 23, 2011

(54) FABRICATING METHOD OF VERTICAL TRANSISTOR

(75) Inventor: Jung-Hua Chen, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/042,471

(22) Filed: Mar. 8, 2011

(65) Prior Publication Data

US 2011/0159652 A1   Jun. 30, 2011

Related U.S. Application Data

(62) Division of application No. 12/368,278, filed on Feb. 9, 2009, now Pat. No. 7,928,490.

(30) Foreign Application Priority Data

Oct. 29, 2008 (TW) ................................ 97141636 A

(51) Int. Cl.
*H01L 21/8238* (2006.01)

(52) U.S. Cl. .................. 438/212; 438/242; 257/E21.41; 257/E21.629

(58) Field of Classification Search .................. 438/212, 438/242, 268; 257/E21.41, E21.629, E21.676
See application file for complete search history.

(56) References Cited

U.S. PATENT DOCUMENTS

2006/0038205 A1 * 2/2006 Abbott et al. ................ 257/239
* cited by examiner

*Primary Examiner* — Hoai v Pham
(74) *Attorney, Agent, or Firm* — Jianq Chyun IP Office

(57) ABSTRACT

A substrate is provided. A pillar protruding out of a surface of the substrate is already formed on the substrate, and a patterned layer is already formed on the pillar. The pillar includes a lower part, a channel region, and an upper part from bottom to top, and the lower part has a first doped region. A gate dielectric layer is formed on a sidewall at one side of the pillar. A surrounding gate is formed on the gate dielectric layer located on the channel region, and a base line electrically connected to the channel region is formed on a sidewall at the other side of the pillar. A second doped region is formed in the upper part of the pillar.

5 Claims, 18 Drawing Sheets

FABRICATING METHOD OF VERTICAL TRANSISTOR

CROSS-REFERENCE TO RELATED APPLICATION

This application is a divisional application of and claims the priority benefit of U.S. non-provisional application Ser. No. 12/368,278, filed on Feb. 9, 2009, now allowed, which claims the priority benefit of Taiwan application serial no. 97141636, filed on Oct. 29, 2008. The entirety of each of the above-mentioned patent applications is hereby incorporated by reference herein and made a part of specification.

BACKGROUND OF THE INVENTION

1. Field of the Invention

The invention relates to a fabricating method of a transistor structure. More particularly, the invention relates to a fabricating method of a vertical transistor and a vertical transistor array.

2. Description of Related Art

As sizes of devices are gradually decreased, to satisfy different applications of integrated circuits, a transistor pattern of a current semiconductor device is developed from a planar gate structure to a vertical gate structure.

However, a great problem of the semiconductor device of general vertical surrounding gate structure is the generation of floating body effect, especially when gate length thereof is greater than 40 nanometers. Wherein, the so-called floating body effect refers that in the semiconductor device, charges are accumulated in a channel, and if the charges are accumulated to certain degree, not only threshold voltage of the device is influenced, but also a current of drain area is suddenly increased. Moreover, the floating body effect may cause problem that device turns on automatically even no any voltage is exerted. Accordingly, reliability and stability of the device are influenced and current leakage is occurred.

SUMMARY OF THE INVENTION

The invention is directed to a method for fabricating a vertical transistor, by which the vertical transistor having a better channel control capability is fabricated.

The invention provides a method for fabricating a vertical transistor. The method includes following steps. A substrate is provided, on which a pillar protruding out of a surface of the substrate is already formed, and a patterned layer is already formed on the pillar. Wherein, the pillar includes a lower part, a channel region and an upper part from bottom to top, and the lower part has a first doped region. A gate dielectric layer is formed on a sidewall at one side of the pillar. A surrounding gate is formed on the gate dielectric layer located on the channel region, and a base line electrically connected to the channel region is formed on a sidewall at the other side of the pillar. A second doped region is formed in the upper part of the pillar.

In an embodiment of the invention, after the first doped region is formed, and before the gate dielectric layer is formed, the method further includes forming a bit line on a sidewall of the first doped region.

In an embodiment of the invention, a method of forming the bit line includes following steps. A first dielectric layer is formed on the substrate at two sides of the pillar. A first conductive layer is conformally formed on the substrate, and the first conductive layer covers the pillar and the first dielectric layer. An etching back process is performed to the first conductive layer.

In an embodiment of the invention, the method of forming the first doped region includes ion implantation.

In an embodiment of the invention, a method of forming the gate dielectric layer includes following steps. A second dielectric layer is formed on the substrate, and the second dielectric layer covers the pillar and the patterned layer. A part of the second dielectric layer is removed until the patterned layer is exposed. A first patterned mask layer is formed on the second dielectric layer, and the first patterned mask layer is located on a part of the second dielectric layer closed to the other side of the pillar. The first patterned mask layer is used as a mask to remove a part of the second dielectric layer, so as to form a first opening, wherein the first opening exposes the channel region and the sidewall at one side of the upper part. The first patterned mask layer is removed. The gate dielectric layer is formed on the channel region and the sidewall at one side of the upper part.

In an embodiment of the invention, a method of forming the surrounding gate and the base line includes following steps. A second conductive layer filling up the first opening is formed in the first opening. A part of the second dielectric layer closed to the other side of the pillar is removed to form a second opening, wherein the second opening exposes the channel region and the sidewall at the other side of the upper part. A third conductive layer filling up the second opening is formed in the second opening. A second patterned mask layer is formed on the patterned layer, and two sides of the second patterned mask layer respectively cover a part of the second conductive layer and a part of the third conductive layer. The second conductive layer and the third conductive layer not covered by the second patterned mask layer are removed. Next, the second patterned mask layer is removed. The second conductive layer and the third conductive layer located at two sides of the upper part of the pillar are removed.

In an embodiment of the invention, the method of forming the second doped region includes ion implantation.

Accordingly, since one side of the vertical transistor in the vertical transistor array has a base line, the problem of floating body effect can be effectively prevented, so that reliability and stability of the devices can be improved, and a current leakage problem can be prevented.

Moreover, the vertical transistor having a surrounding gate structure can be fabricated according to the method of the invention, so that the vertical transistor may have a better channel control capability.

In order to make the aforementioned and other features and advantages of the invention comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A-9A are cross-sectional views of FIGS. 1-9 along a sectional line A-A'.

FIGS. 1B-9B are cross-sectional views of FIGS. 1-9 along a sectional line B-B'.

DESCRIPTION OF EMBODIMENTS

FIGS. 1-9 are top views illustrating a fabrication flowchart of a vertical transistor array according to an embodiment of the invention. FIGS. 1A-9A are cross-sectional views of FIGS. 1-9 along a sectional line A-A'. FIGS. 1B-9B are cross-sectional views of FIGS. 1-9 along a sectional line B-B'. For the fabrication flowchart of the vertical transistor, if there is no specific explanation, cross-sectional views along a direction 116 of FIG. 1 (i.e. a direction of the sectional line B-B') (FIGS. 1B-9B) are mainly used for description, and the cross-sectional views along a direction 114 (i.e. a direction of the sectional line A-A') (FIGS. 1A-9A) are used for auxiliary description.

Figure 1:
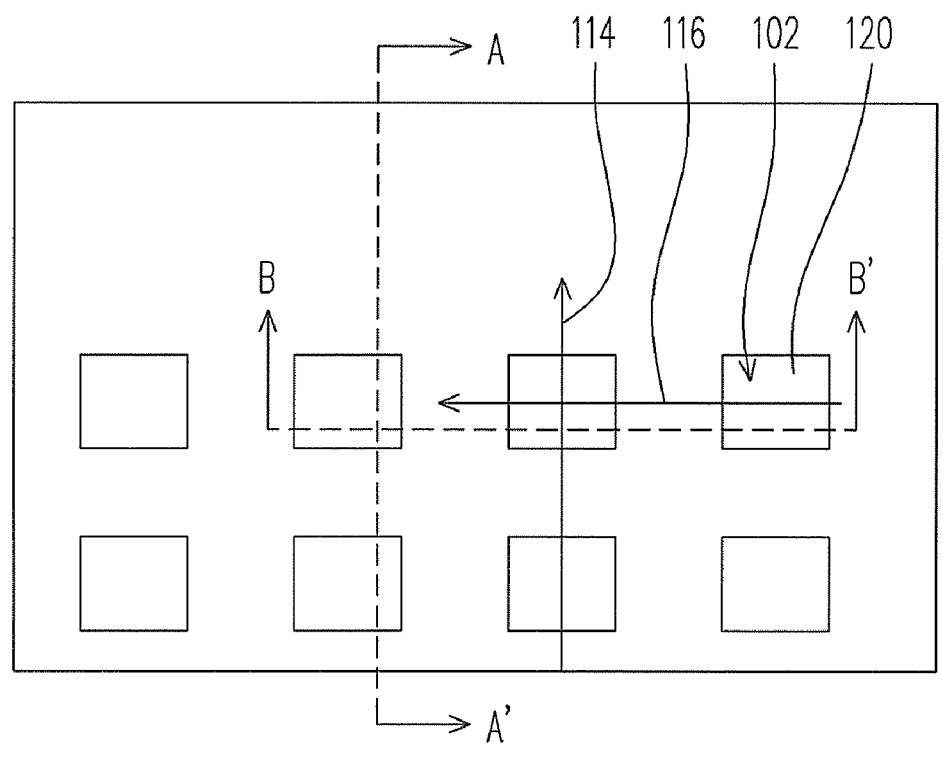
FIGS. 1-9 are top views illustrating a fabrication flowchart of a vertical transistor array according to an embodiment of the invention.
Figure 1A:
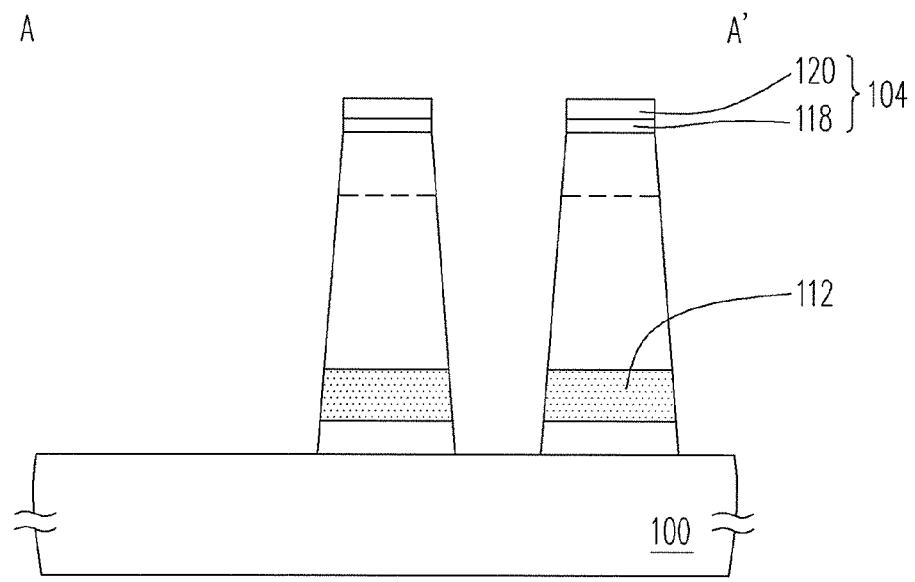
Figure 1B:
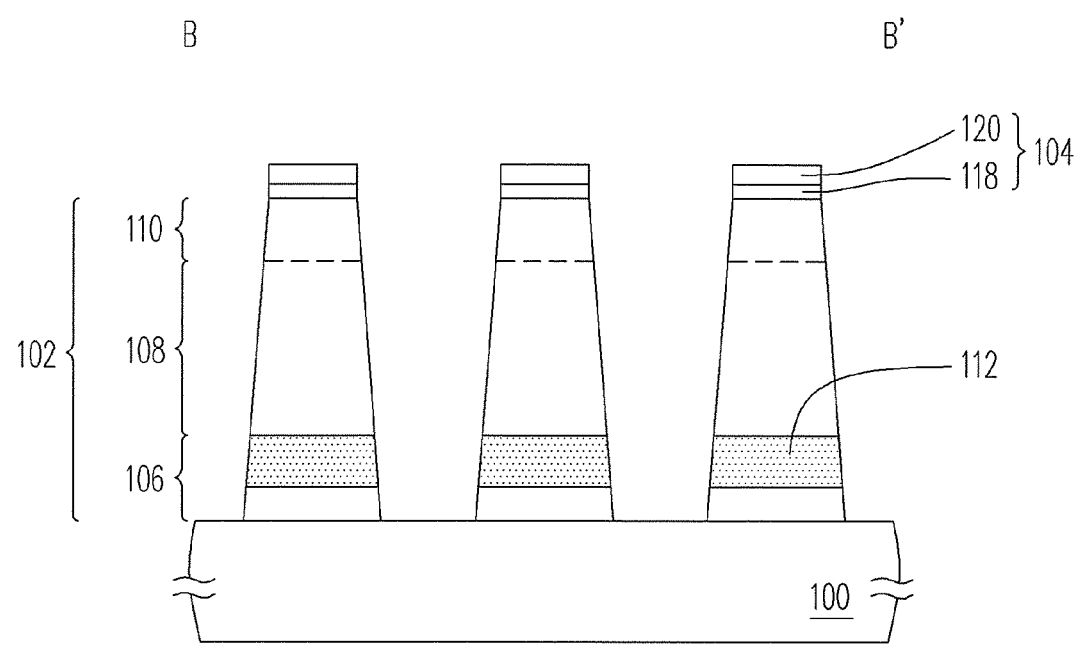

Referring to FIG. 1, FIG. 1A and FIG. 1B, a substrate 100 is first provided, on which pillars 102 protruding out of a surface of the substrate 100 are already formed, and patterned layers 104 are already formed on the pillars 102. Each of the pillars 102 includes a lower part 106, a channel region 108 and an upper part 110 from bottom to top, and the lower part 106 of the pillar 102 has a doped region 112 which can be used as a source/drain. The pillars 102 are arranged along the direction 114 and the direction 116. The patterned layer 104, for example, includes a patterned oxide layer 118 and a patterned nitride layer 120.

In the present embodiment, the pillars 102 are, for example, square pillars, though the invention is not limited thereto.

Wherein, the pillars 102 are, for example, formed based on the following steps. First, an oxide layer is formed on the substrate 100, and then the doped region 112 is formed on the substrate 100 via ion implantation. Next, the patterned nitride layer 120 is formed on the oxide layer. Next, a dry etching process is performed to the oxide layer and the substrate 100 while using the patterned nitride layer 120 as a mask, so as to form the pillars 102 and the patterned oxide layer 118. In the present embodiment, the pillars 102 are formed according to the above steps, though the invention is not limited thereto.

Figure 2:
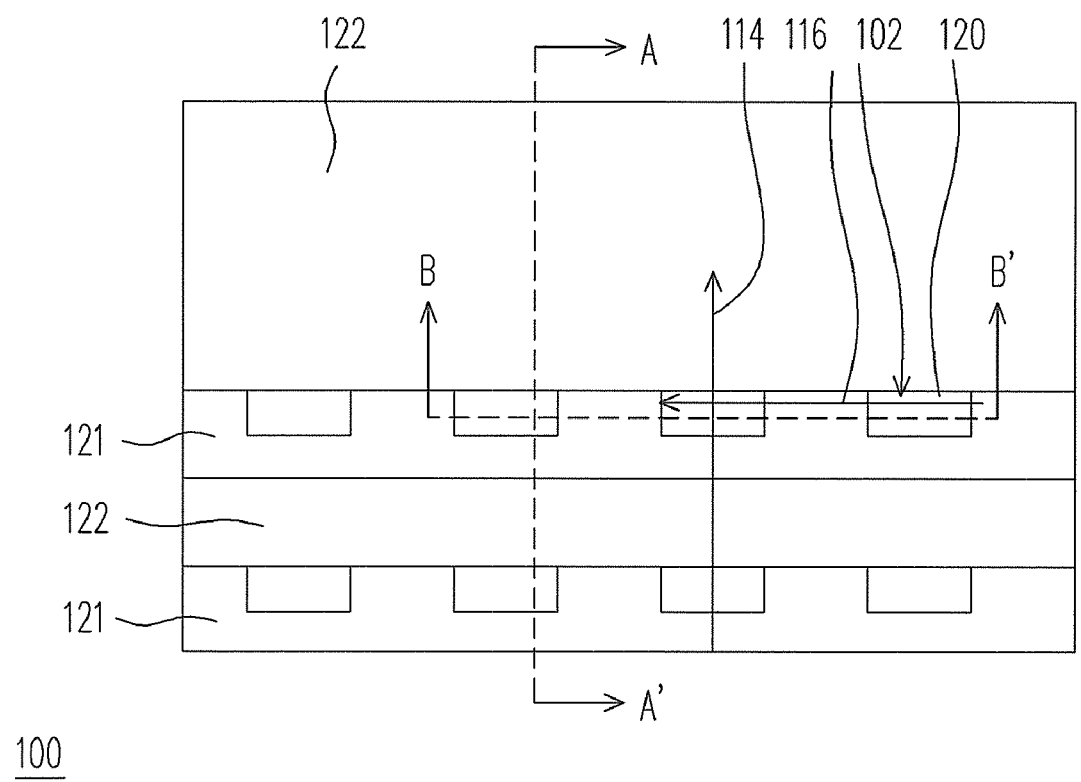
Figure 2A:
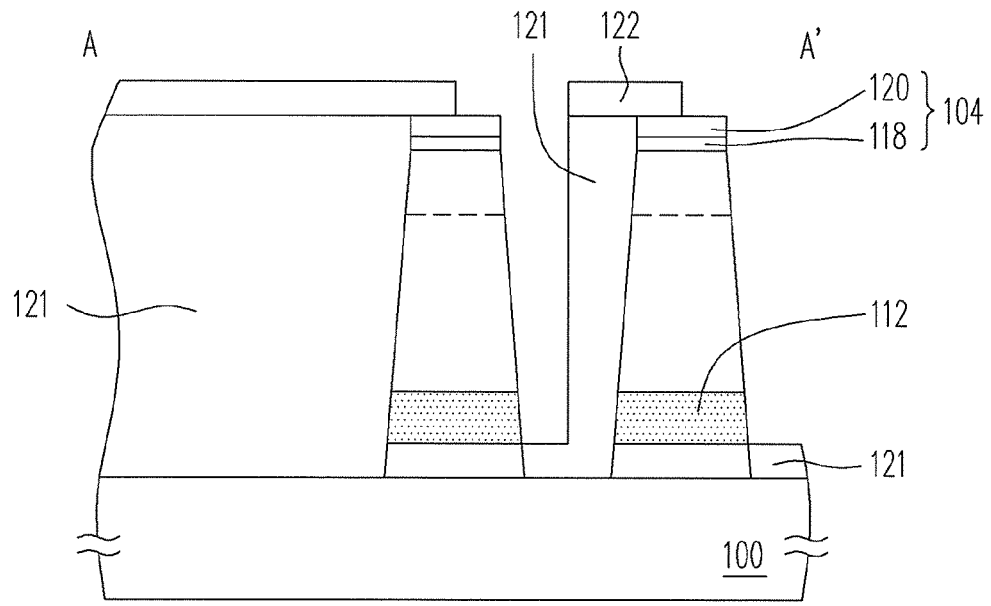
Figure 2B:
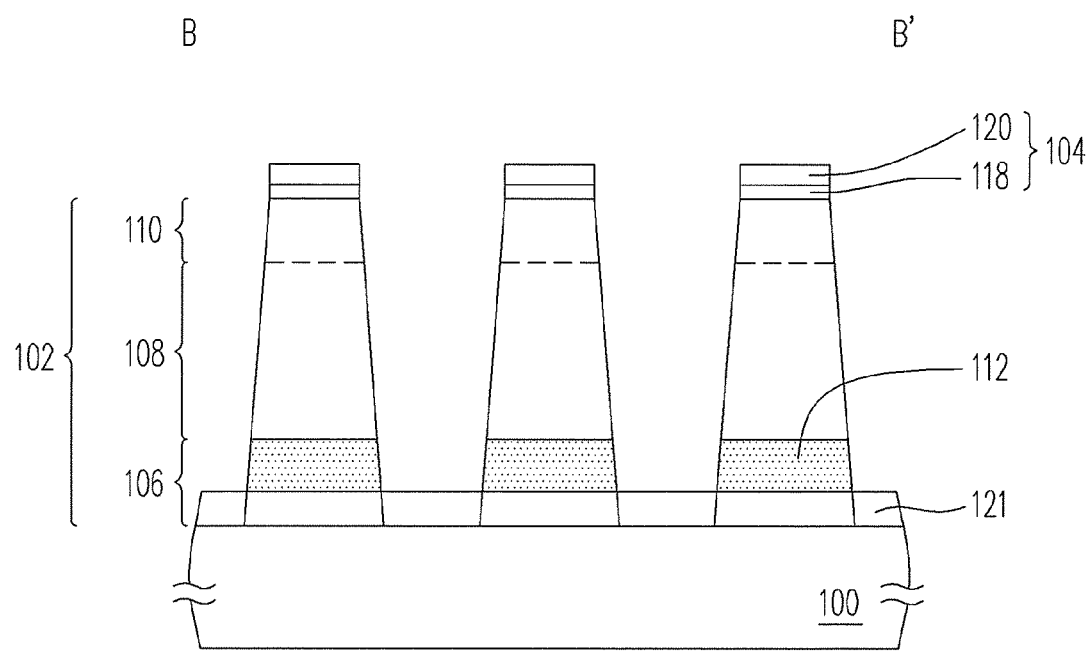

Next referring to FIG. 2, FIG. 2A and FIG. 2B, a dielectric layer 121 covering the pillars 102 and the patterned layer 104 is formed on the substrate 100. The material of the dielectric layer 121 can be silicon oxide, and a method of forming the dielectric layer 121 can be chemical vapor deposition.

Next, a patterned mask layer 122 is formed on the dielectric layer 121, and the patterned mask layer 122 extends along the direction 116. The material of the patterned mask layer 122 can be a photoresist material, and a method of forming the patterned mask layer 122 can be lithography.

Next, a part of the dielectric layer 121 is removed while using the patterned mask layer 122 as a mask, so as to form the dielectric layer 121 on the substrate 100 at two sides of the pillars 102. According to the cross-sectional view along the sectional line B-B', a height of a top surface of the dielectric layer 121 is, for example, less than or equal to that of a bottom surface of the doped region 112. The method of removing a part of the dielectric layer 121 can be dry etching.

Figure 3:
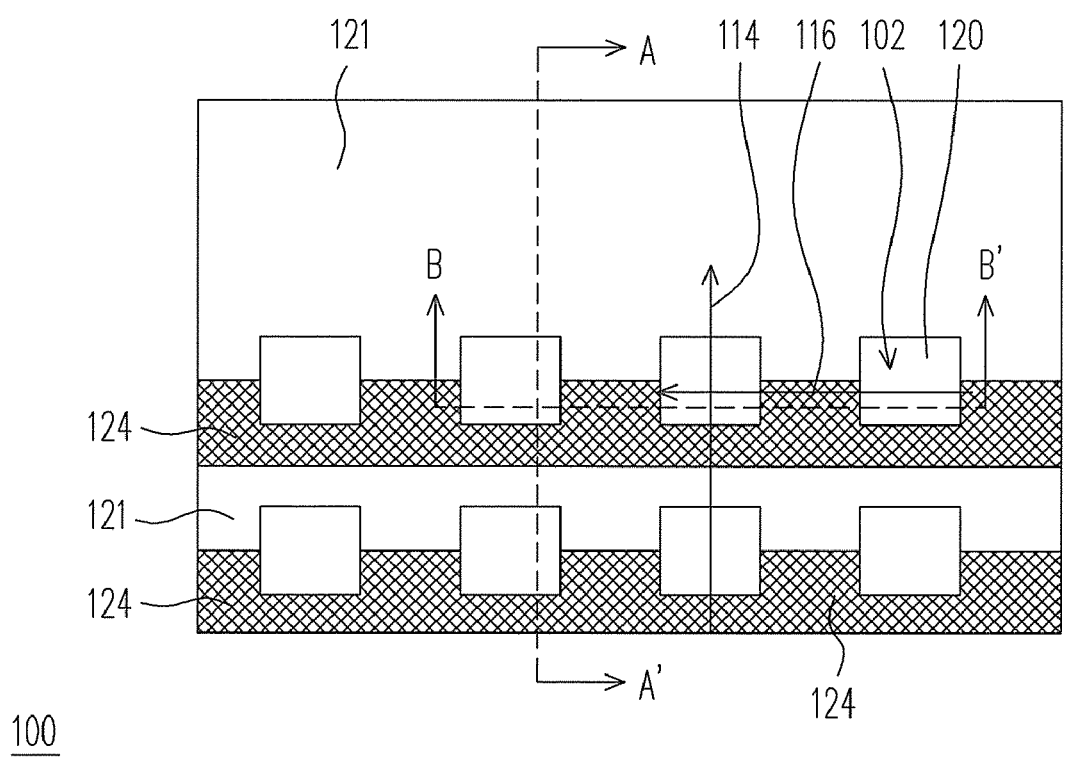
Figure 3A:
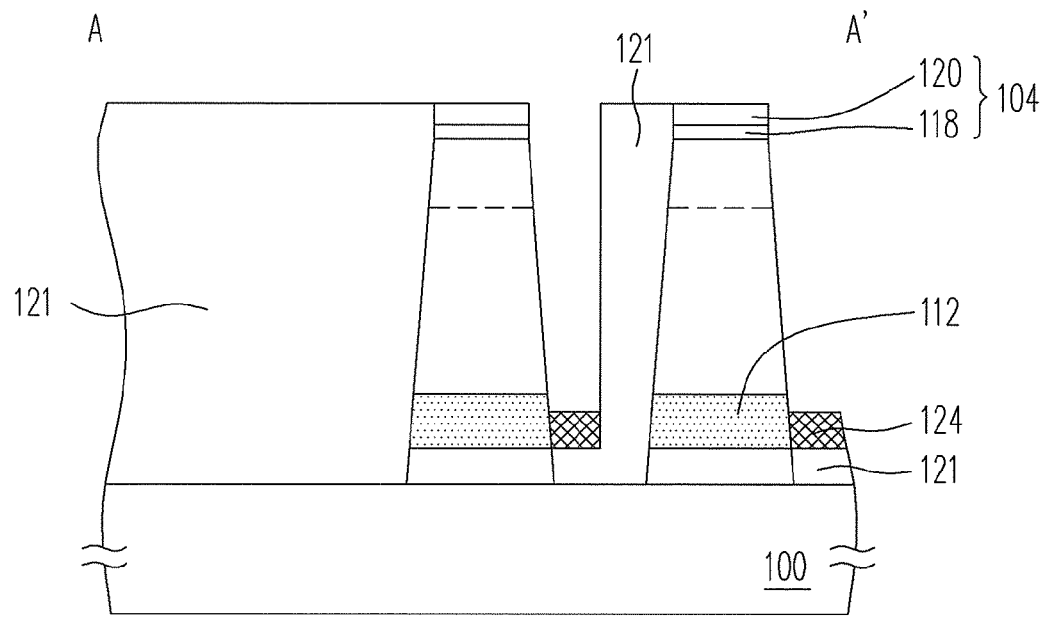
Figure 3B:
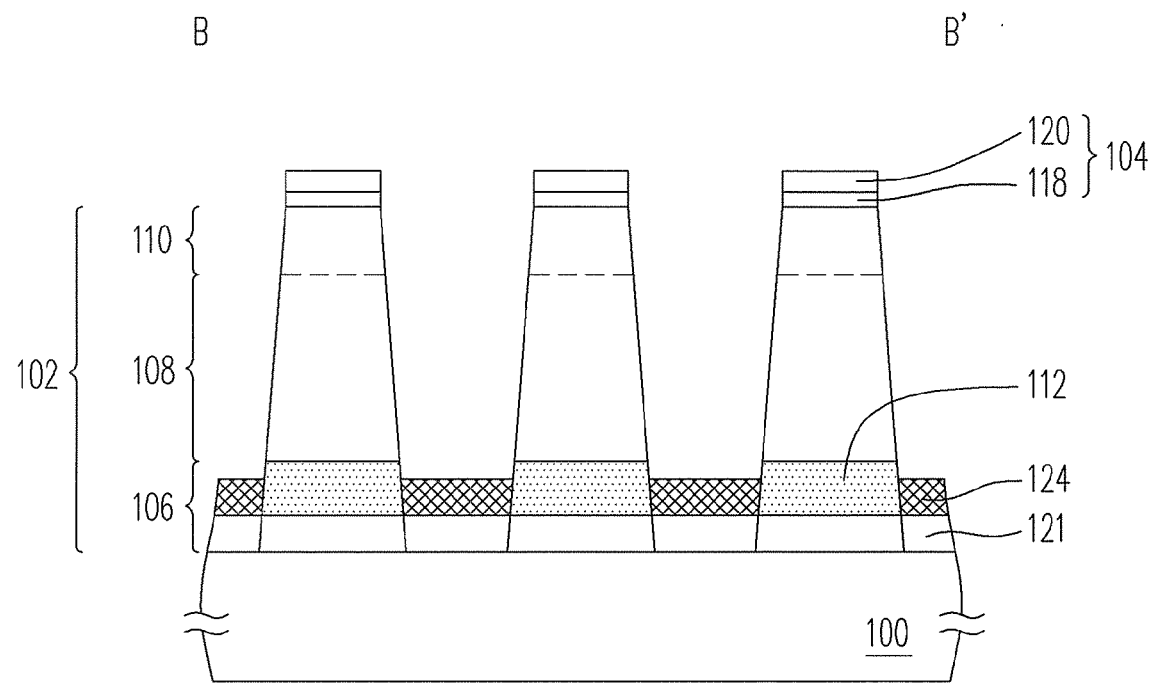

Next, referring to FIG. 3, FIG. 3A and FIG. 3B, the patterned mask layer 122 is removed, and the method of removing the patterned mask layer 122 can be dry photoresist removing.

Next, a conductive layer (not shown) is conformally formed on the substrate 100, and the conductive layer covers the pillars 102 and the dielectric layer 121. The material of the conductive layer can be doped polysilicon, and the method of forming the conductive layer can be chemical vapor deposition.

Next, an etching back process is performed to the conductive layer to form bit lines 124 on sidewalls of the doped regions 112. The bit lines 124 are embedded bit lines, which can effectively reduce a size of the device. The bit lines 124 extend along the direction 116, and are electrically connected to the doped regions 112 of the same row of the pillars 102. In the present embodiment, the bit lines 124 are formed according to the above method, though the invention is not limited thereto. The material of the bit line includes polysilicon, tungsten or other widely used conductive materials.

Figure 4:
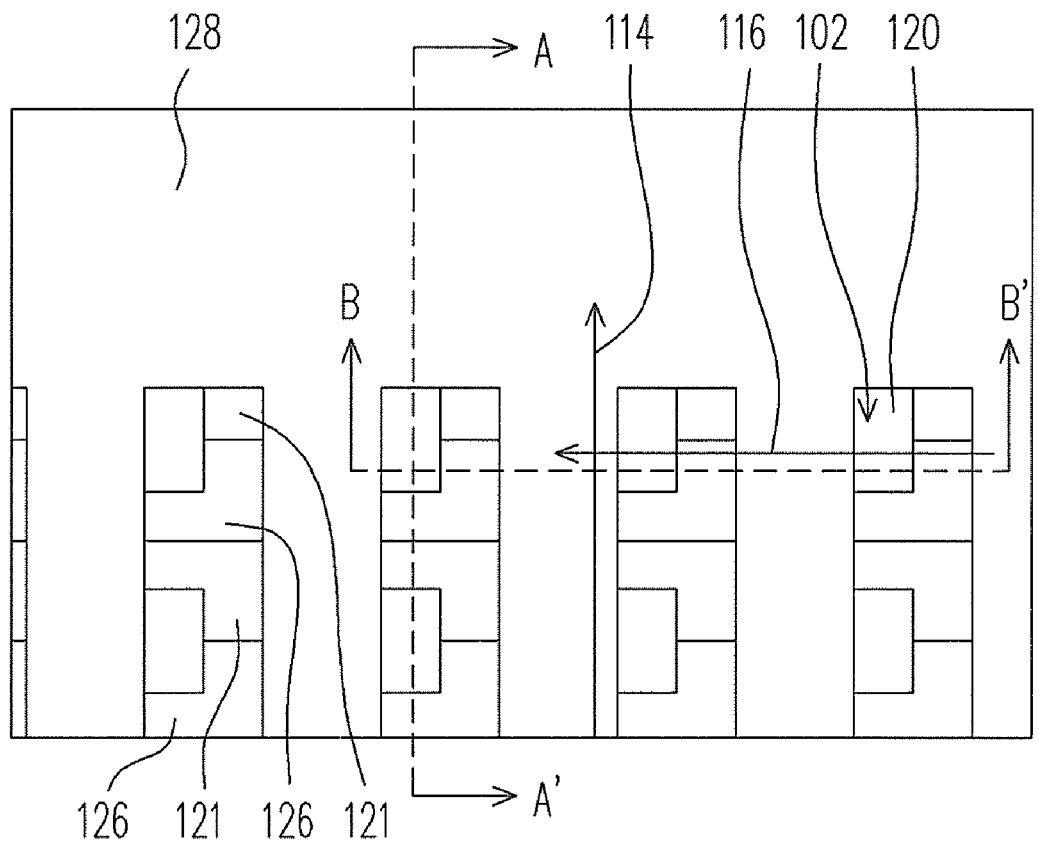
Figure 4A:
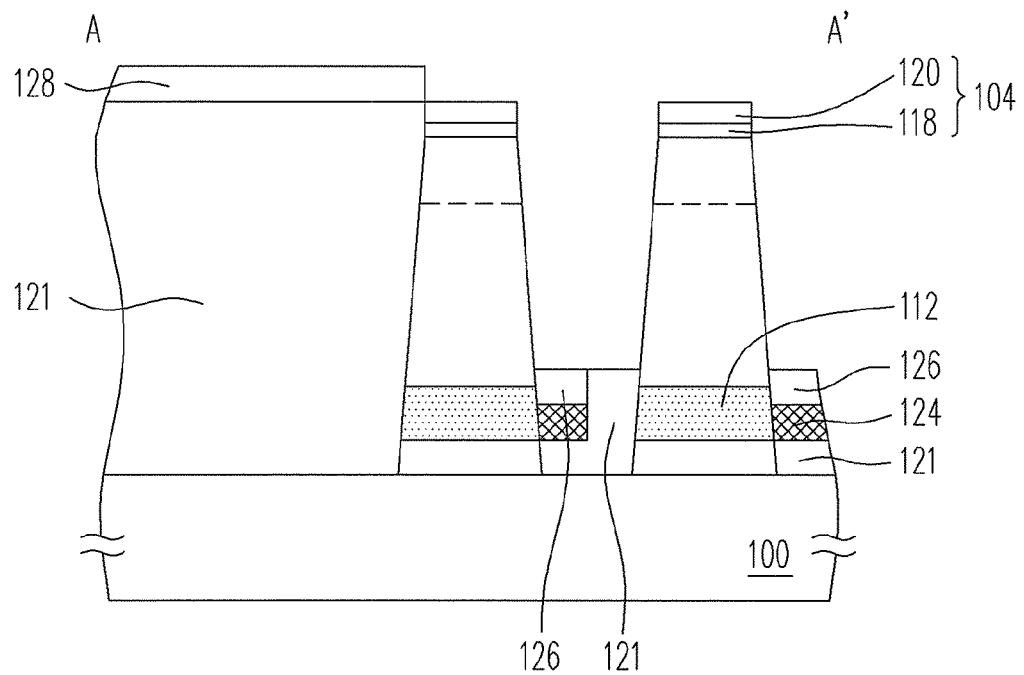
Figure 4B:
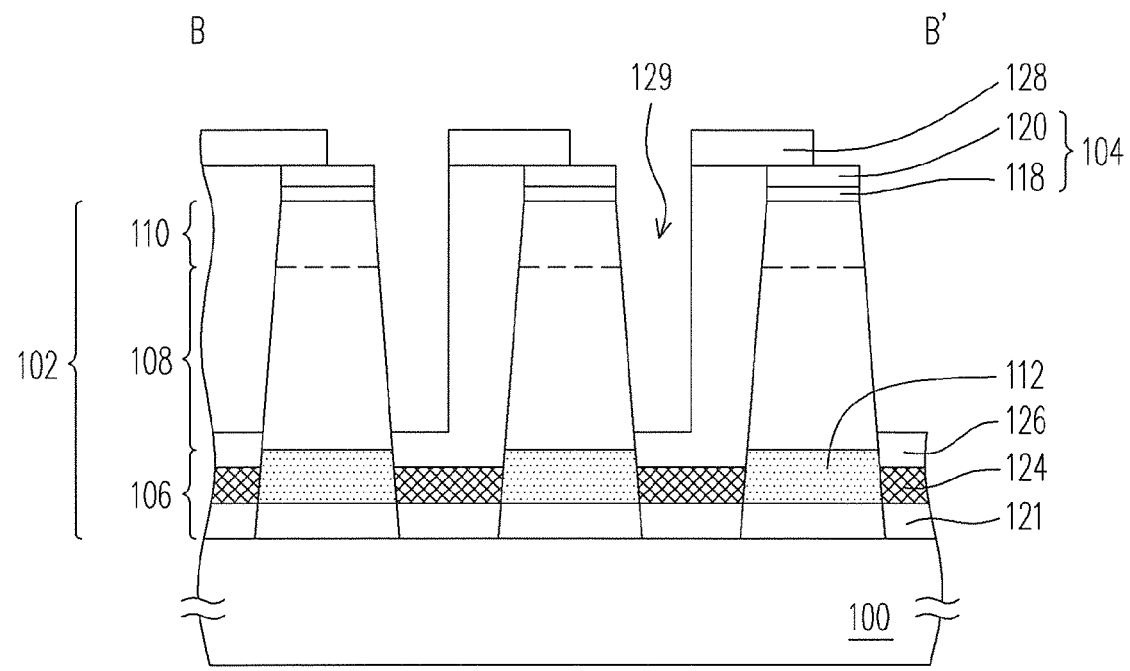

Next, referring to FIG. 4, FIG. 4A and FIG. 4B, a dielectric layer 126 is formed on the substrate 100, wherein the dielectric layer 126 covers the pillars 102 and the patterned layer 104. The material of the dielectric layer 126 can be silicon oxide, and a method of forming the dielectric layer 126 can be chemical vapor deposition.

Next, a part of the dielectric layer 126 is removed until the patterned layer 104 is exposed. The method of removing a part of the dielectric layer 126 is to perform a chemical mechanical polishing process to the dielectric layer 126 by using the patterned layer 104 as a polishing stop layer.

Next, a patterned mask layer 128 is formed on the dielectric layer 126, wherein the patterned mask layer 128 is located on a part of the dielectric layer 126 closed to the other sides of the pillars 102. The material of the patterned mask layer 128 can be a photoresist material, and a method of forming the patterned mask layer 128 can be lithography.

Next, a part of the dielectric layer 126 is removed while using the patterned mask layer 128 as a mask, so as to form openings 129, wherein each of the openings 129 exposes the channel region 108 and the sidewall at a side of the upper part 110. The method of removing a part of the dielectric layer 126 can be dry etching.

Figure 5:
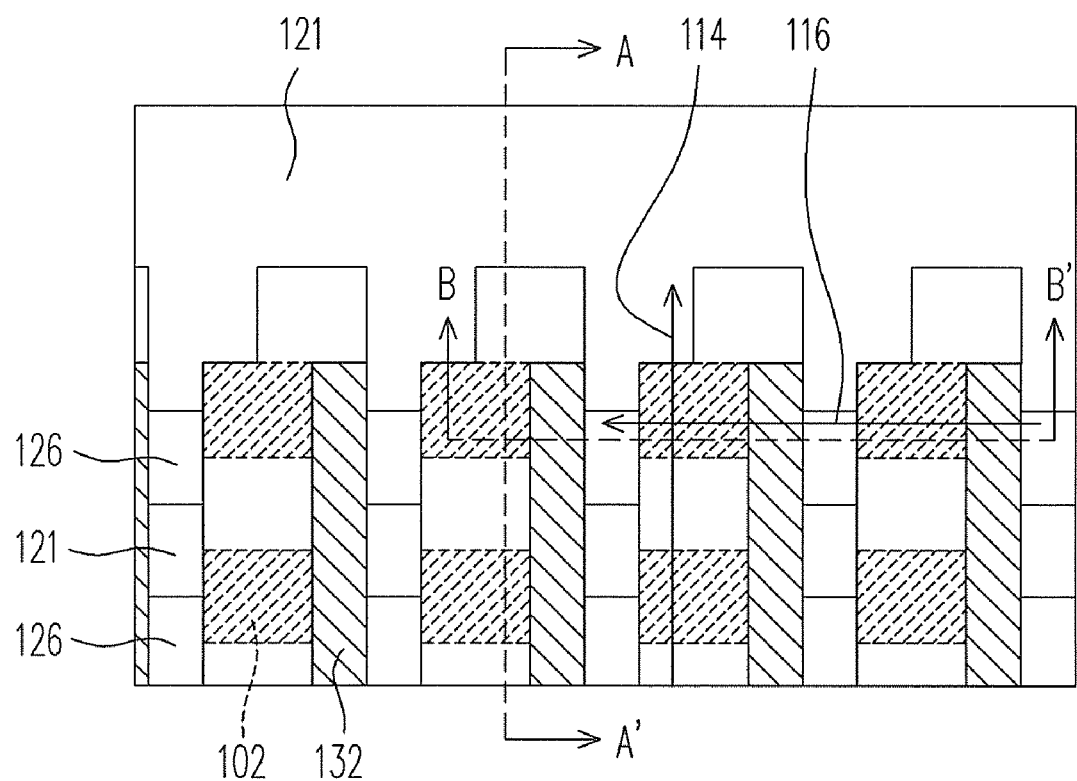
Figure 5A:
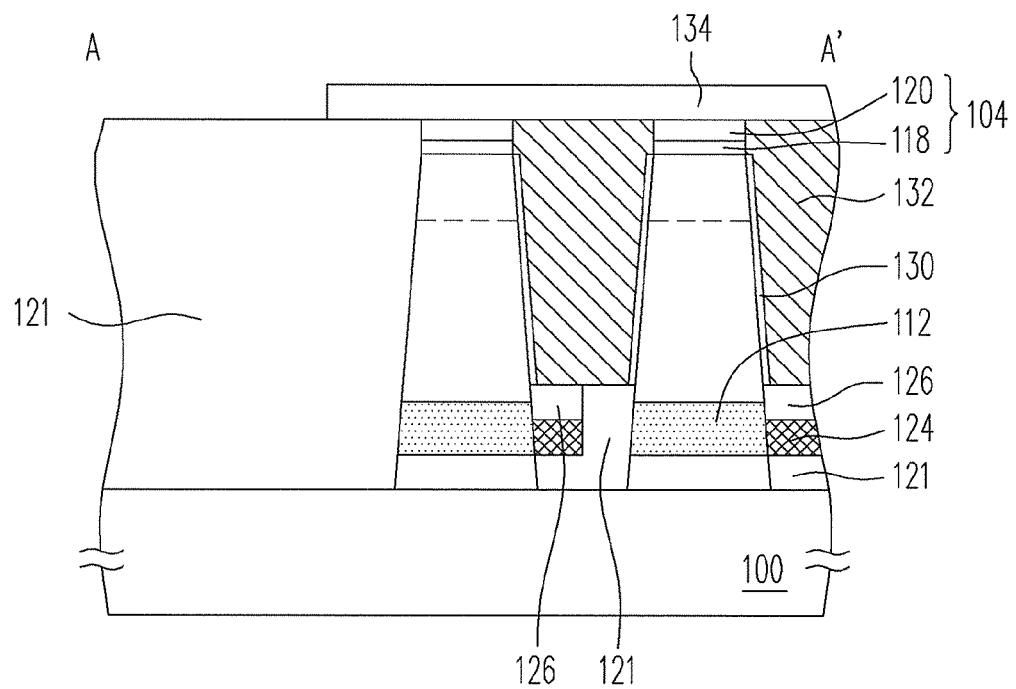
Figure 5B:
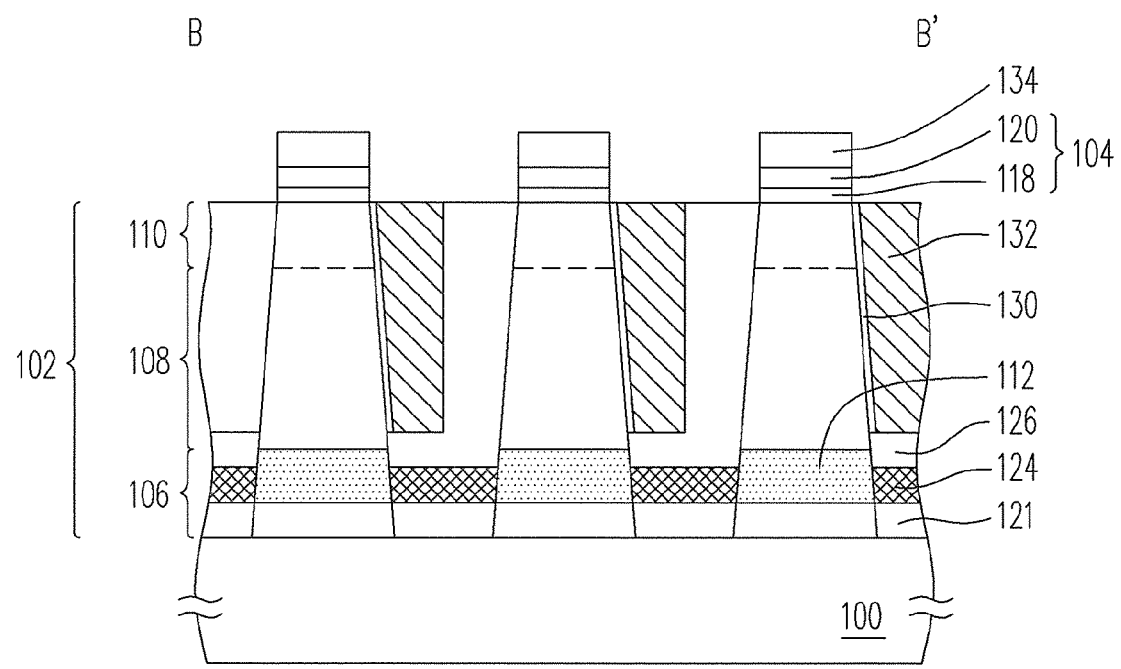

Next, referring to FIG. 5, FIG. 5A and FIG. 5B, the patterned mask layer 128 is removed, and the method of removing the patterned mask layer 128 can be dry photoresist removing.

Next, a gate dielectric layer 130 is formed on the channel regions 108 and the sidewalls at a side of the upper parts 110. The material of the gate dielectric layer 130 can be silicon oxide, and the method of forming the gate dielectric layer can be thermal oxidation. In the present embodiment, the gate dielectric layer 130 is formed based on the above method, though the invention is not limited thereto.

Moreover, a conductive layer 132 filling up the openings 129 is formed in the openings 129. The material of the conductive layer 132 can be doped polysilicon, tungsten or other suitable conductive materials. The method of forming the conductive layer 132 includes following steps. First, a conductive material layer (not shown) filling the openings 129 is formed on the substrate 100. Next, the conductive material layer outside the openings 129 is removed according to a chemical mechanical polishing process.

Next, a patterned mask layer 134 is formed on the substrate 100, wherein the patterned mask layer 134 covers a part of the dielectric layer 121. The part of the dielectric layer 121 covered by the patterned mask layer 134 (referring to FIG. 5 and FIG. 5A) can isolate the surrounding gate lines from a connecting lead used for connecting the base lines.

Figure 6:
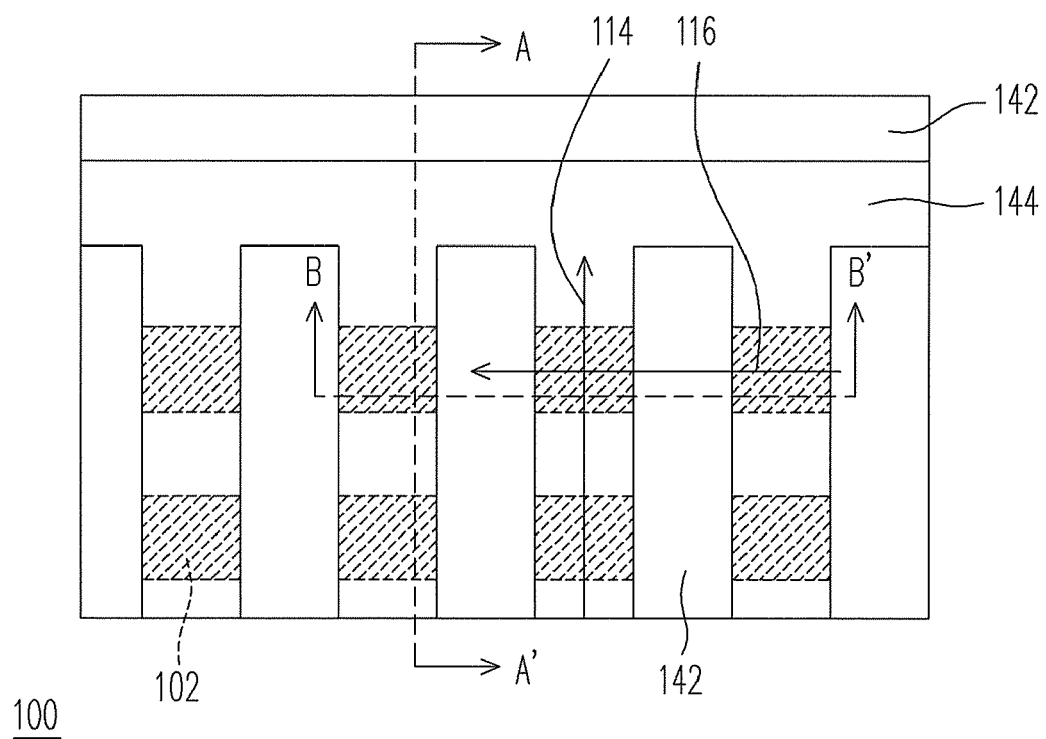
Figure 6A:
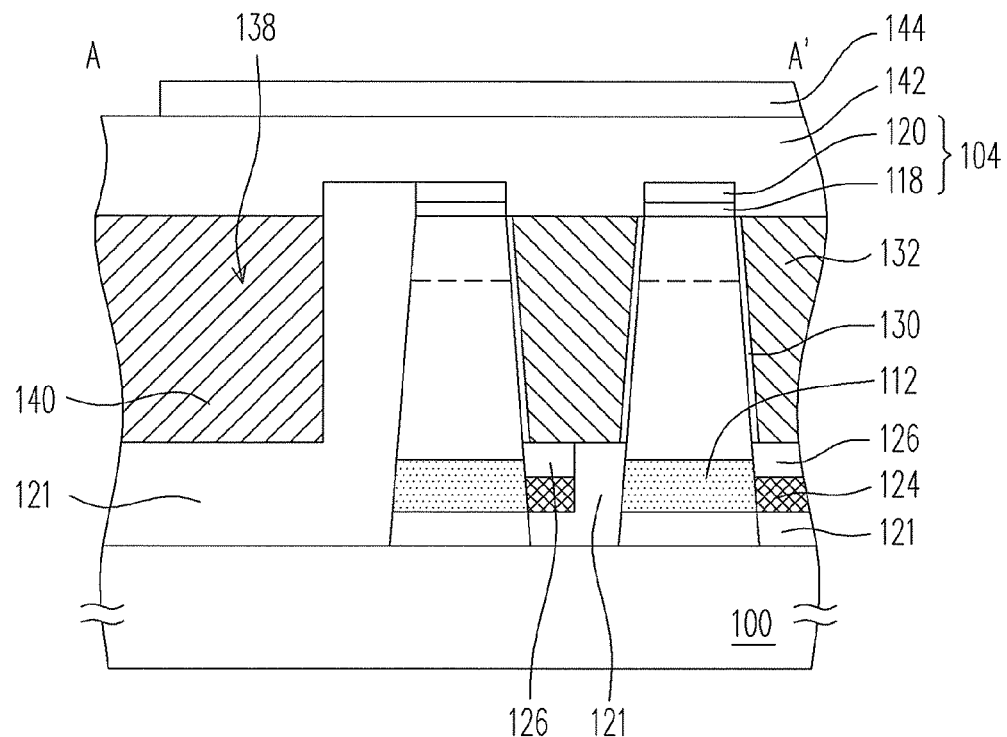
Figure 6B:
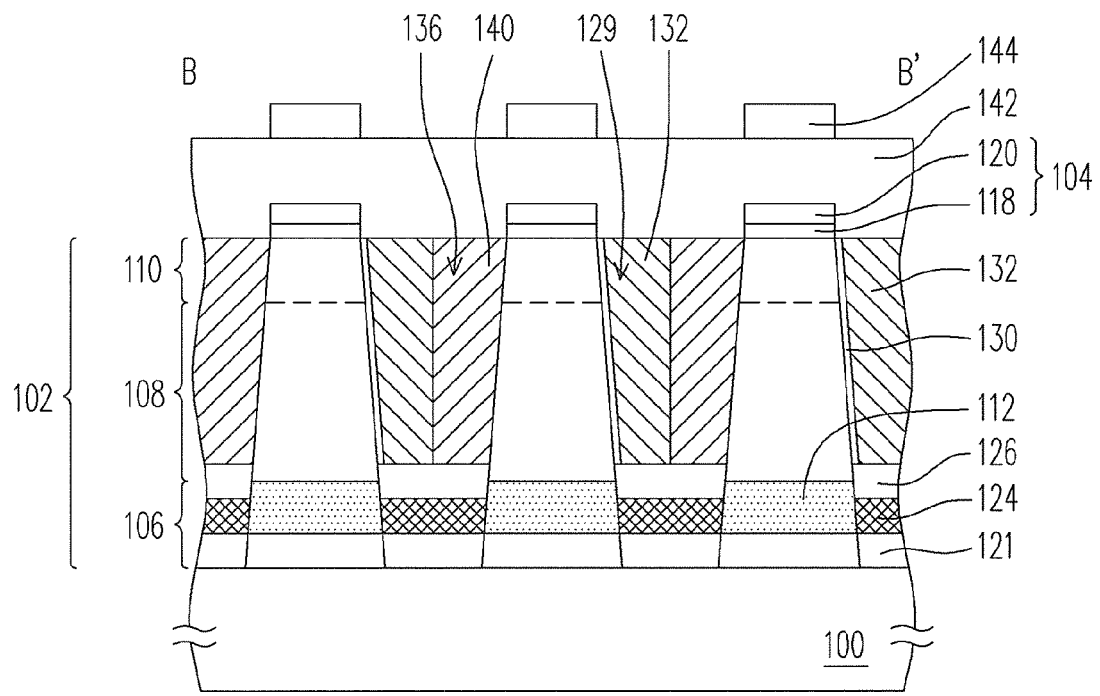

Next, referring to FIG. 6, FIG. 6A and FIG. 6B, a part of the dielectric layer 126 closed to the other sides of the pillars 102 is removed to form openings 136, wherein each of the openings 136 exposes the channel region 108 and a sidewall at the other side of the upper part 110. Now, in FIG. 6A, a part of the dielectric layer 121 not covered by the patterned mask layer 134 is removed to form openings 138. The method of removing a part of the dielectric layer 121 can be dry etching.

Next, a conductive layer 140 filling up the openings 136 and the openings 138 is formed in the openings 136 and the openings 138. The material of the conductive layer 140 can be doped polysilicon, tungsten or other suitable conductive materials. The method of forming the conductive layer 140 includes following steps. First, a conductive material layer (not shown) filling the openings 136 and 138 is formed on the substrate 100. Next, the conductive material layer located at the openings 136 and 138 is removed based on a chemical mechanical polishing process. Moreover, the etching back process is further performed to the conductive layer 132 and the conductive layer 140, so that heights of top surfaces of the conductive layers 132 and 140 are less than or equal to that of a bottom surface of the patterned oxide layer 118.

Next, a mask layer 142 is foamed on the substrate 100, wherein the mask layer 142 covers the patterned layer 104, the dielectric layer 121, the conductive layer 132 and the conductive layer 140. The material of the mask layer can be silicon nitride, and the method of forming the mask layer can be the chemical vapor deposition. The mask layer 142 can be planarized via the chemical mechanical polishing process if necessary.

Next, a patterned mask layer 144 is formed on the mask layer 142 for defining the mask layer 142. The material of the patterned mask layer 144 can be a photoresist material, and the method of forming the patterned mask layer 144 can be lithography.

Figure 7:
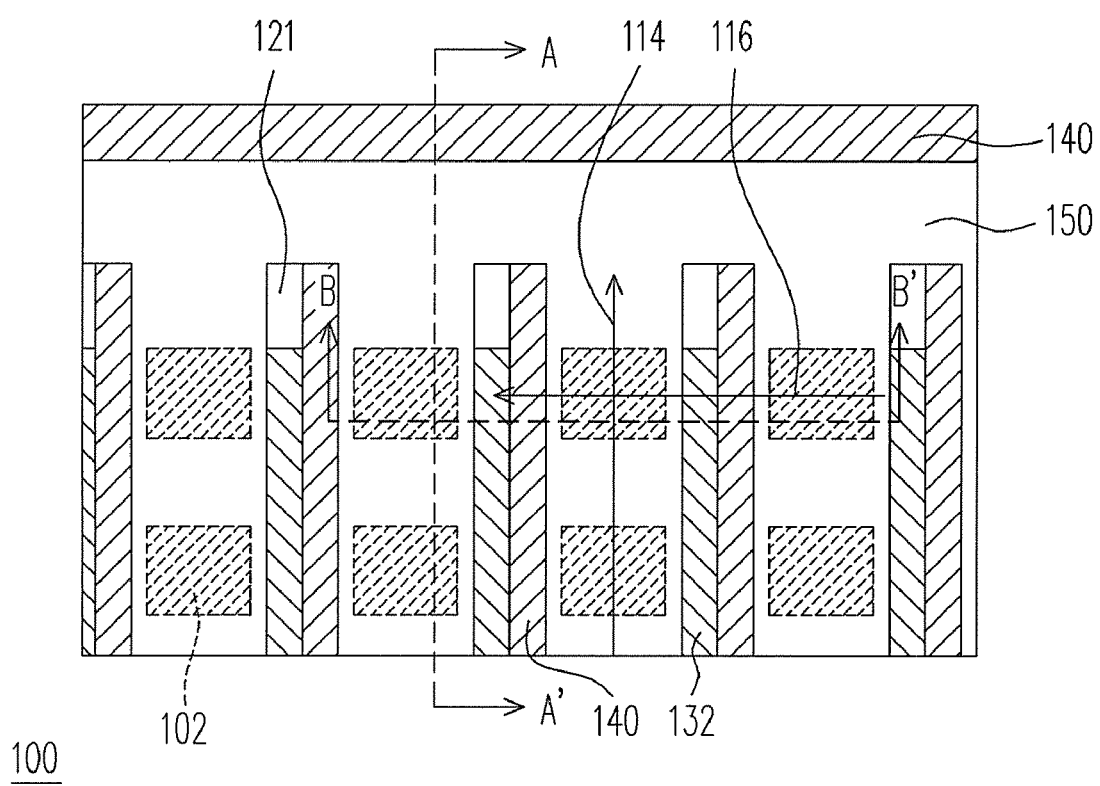
Figure 7A:
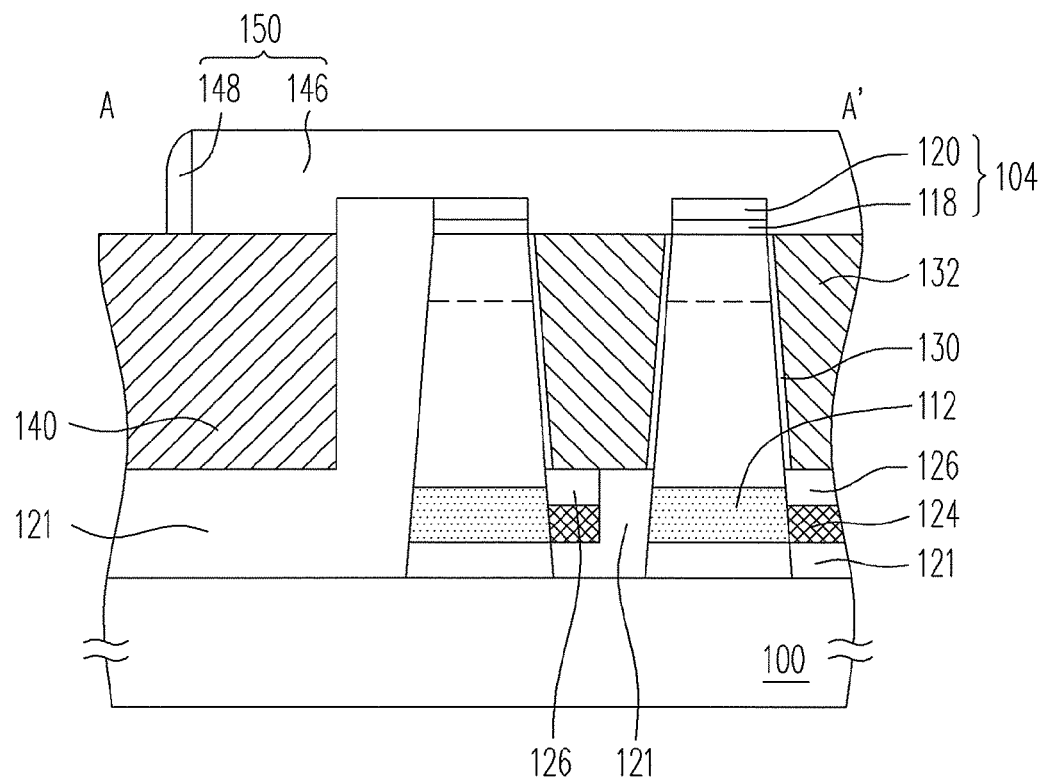
Figure 7B:
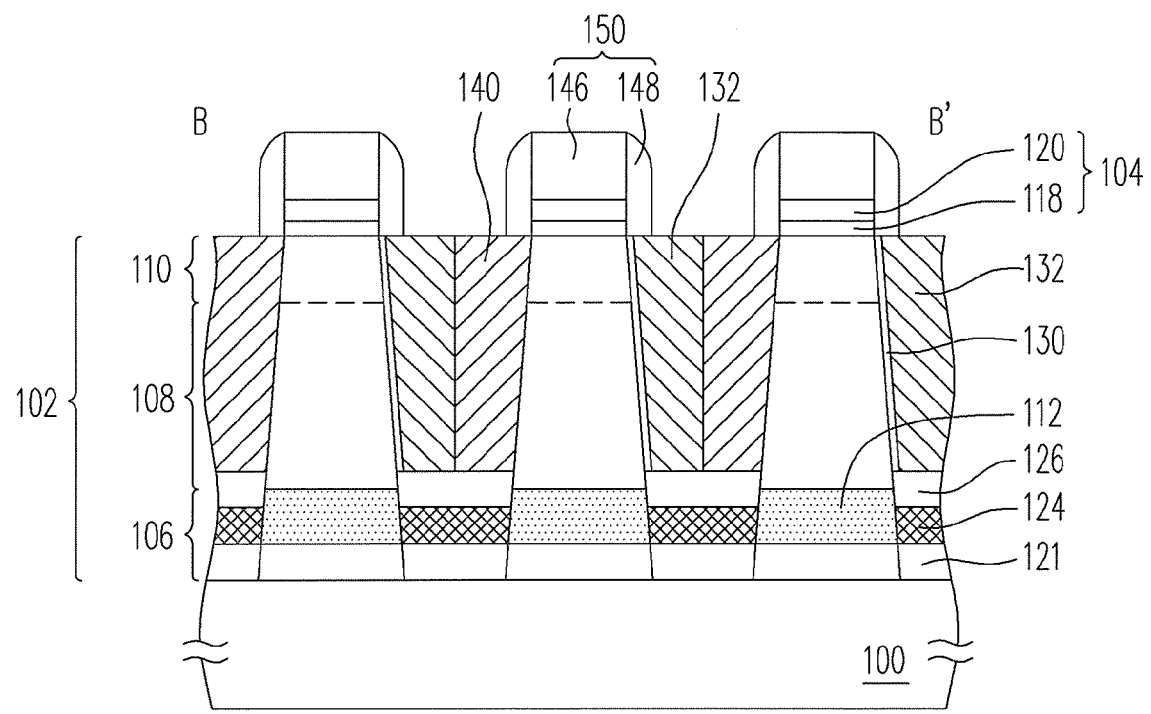

Next, referring to FIG. 7, FIG. 7A and FIG. 7B, a part of the mask layer 142 is removed while using the patterned mask layer 144 as a mask, so as to faun a patterned mask layer 146 on the patterned layer 104.

Next, a gap wall-shape patterned mask layer 148 is formed at two sides of the patterned mask layer 146. The material of the patterned mask layer 148 can be silicon nitride. The method of forming the patterned mask layer 148 includes the following steps. First, a mask layer (not shown) is conformally formed on the substrate 100. Next, an etching back process is performed to the mask layer to form the patterned mask layer 148.

The patterned mask layer 146 and the patterned mask layer 148 form a patterned mask layer 150, wherein two sides of the patterned mask layer 150 respectively cover a part of the conductive layer 132 and a part of the conductive layer 140. Now, in FIG. 7A, the patterned mask layer 150 covers a part of the conductive layer 140.

Figure 8:
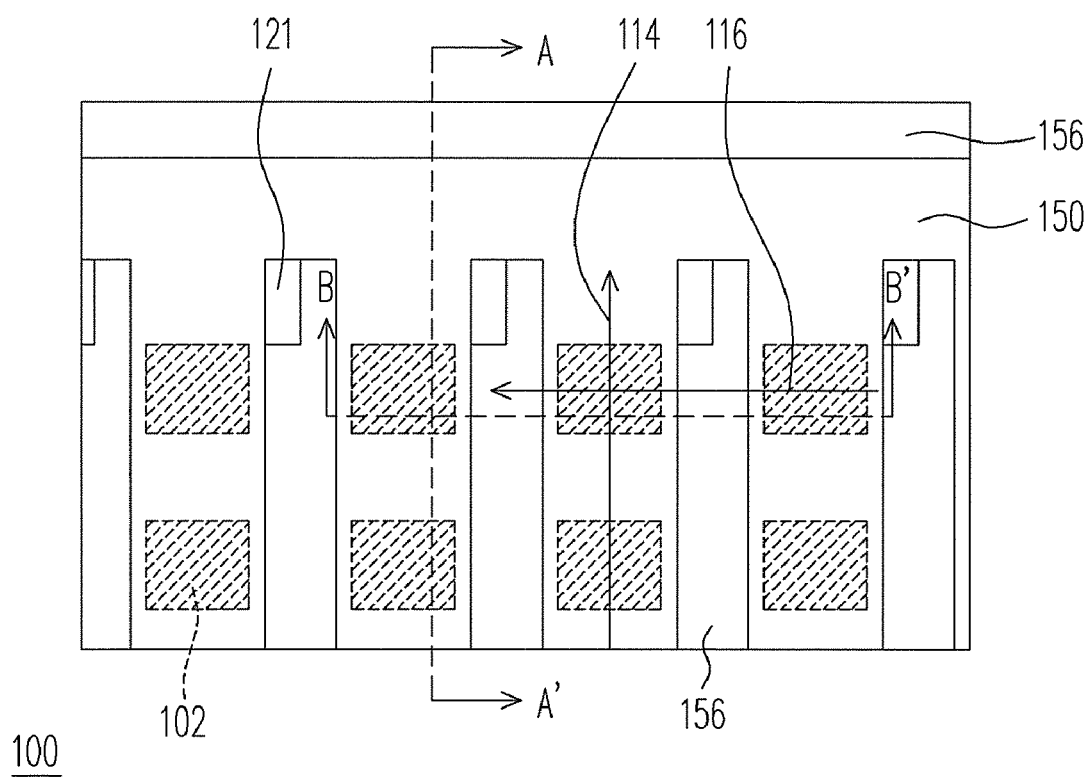
Figure 8A:
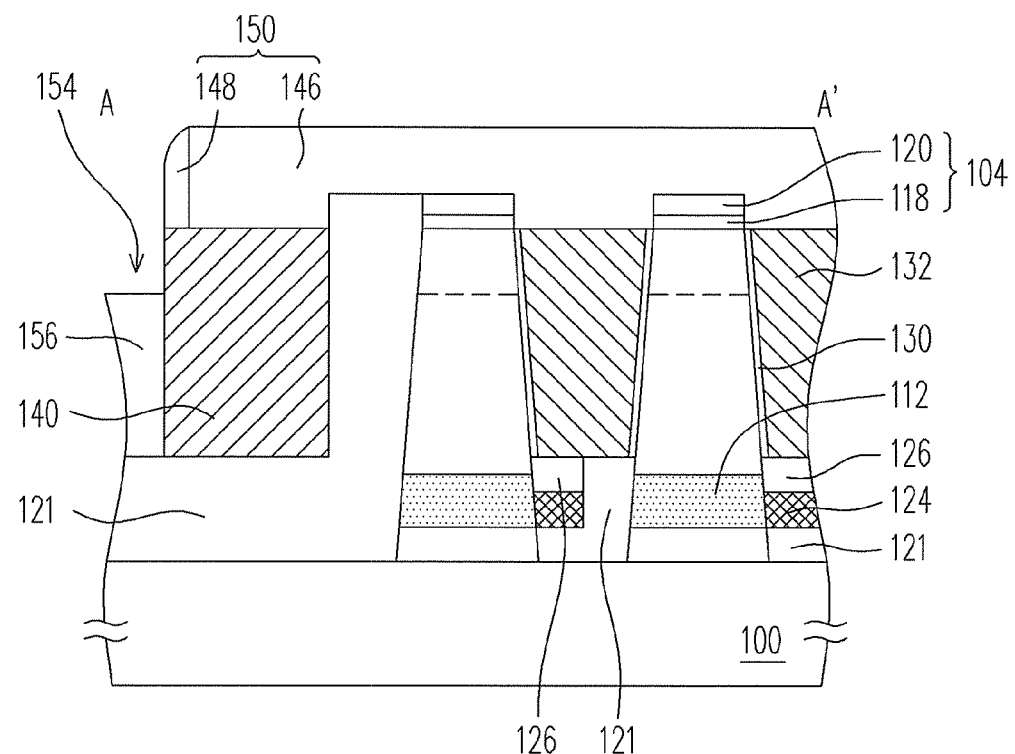
Figure 8B:
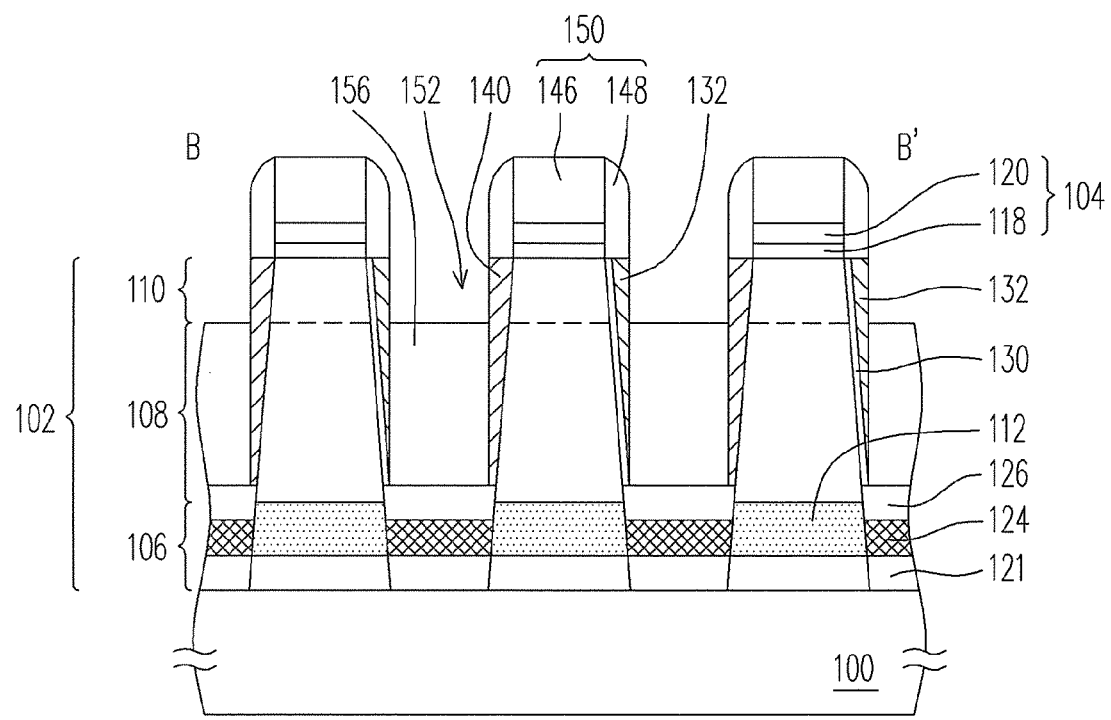

Next, referring to FIG. 8, FIG. 8A and FIG. 8B, the conductive layer 132 and the conductive layer 140 not covered by the patterned mask layer 150 is removed to form openings 152. Now, in FIG. 8A, the conductive layer 140 not covered by the patterned mask layer 150 is removed to form openings 154. The method of removing a part of the conductive layer 132 and a part of the conductive layer 140 can be dry etching.

Next, a dielectric layer 156 is formed in the openings 152 and 154, and a height of the dielectric layer 156 can be equal to the height of the bottom surface of the upper part 110. The material of the dielectric layer 156 can be silicon oxide. The method of forming the dielectric layer 156 includes following steps. First, a dielectric material layer (not shown) is formed via the chemical vapor deposition. Next, an etching process is performed to the dielectric material layer to form the dielectric layer 156.

Figure 9:
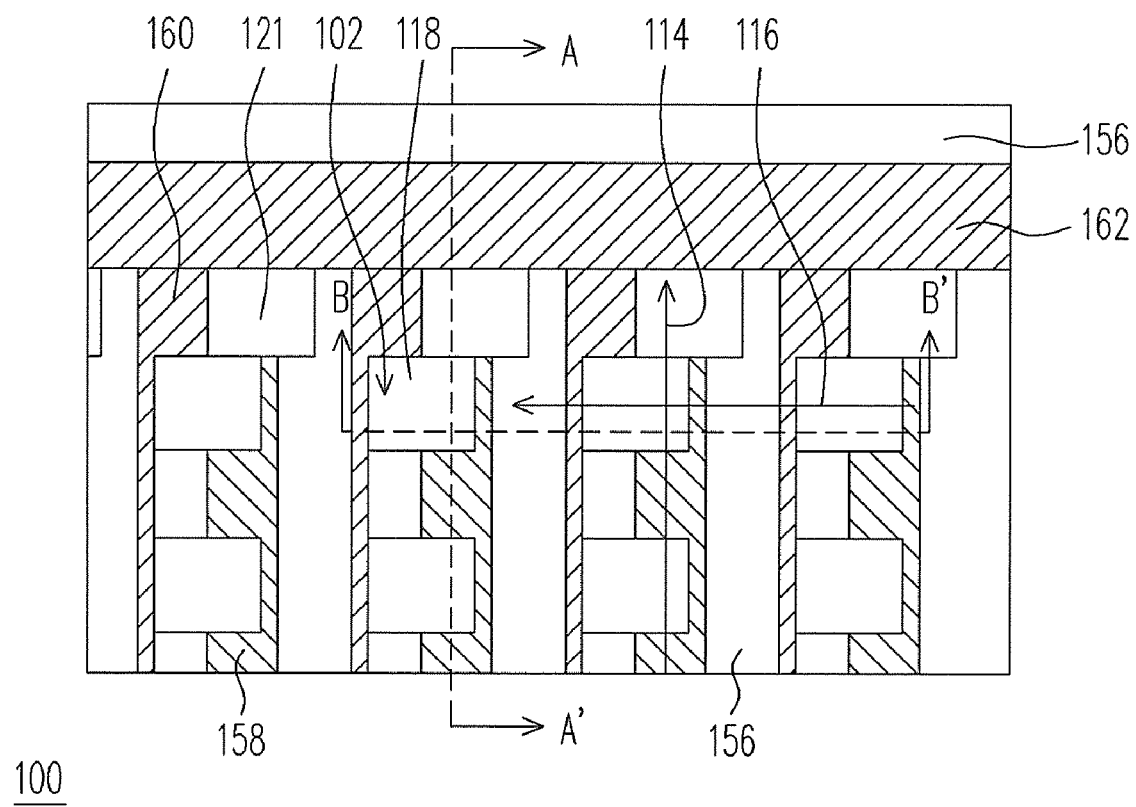
Figure 9A:
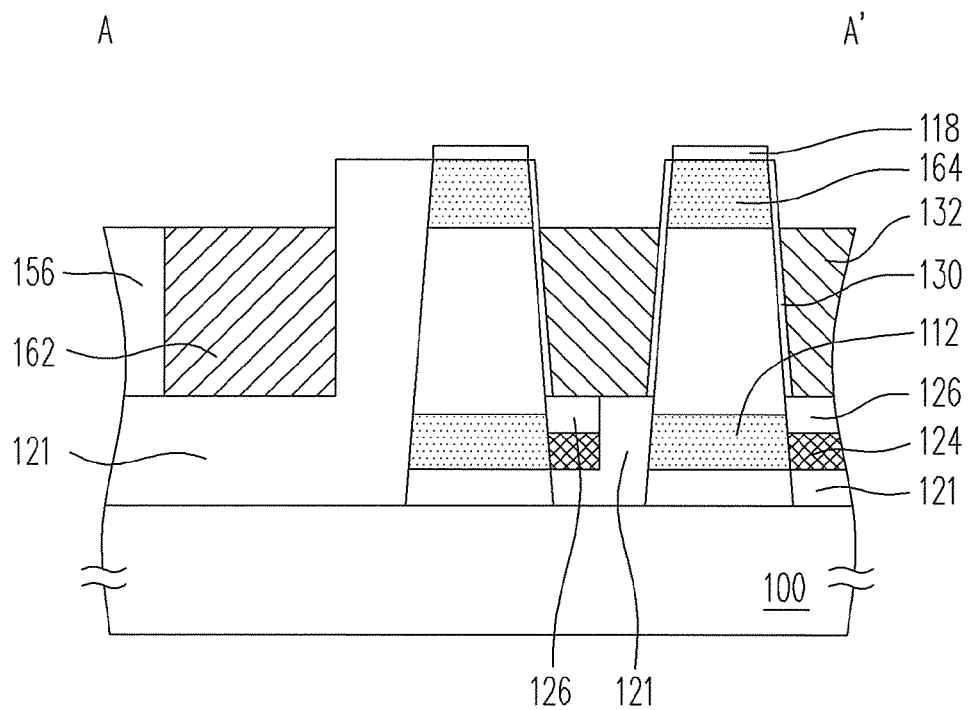
Figure 9B:
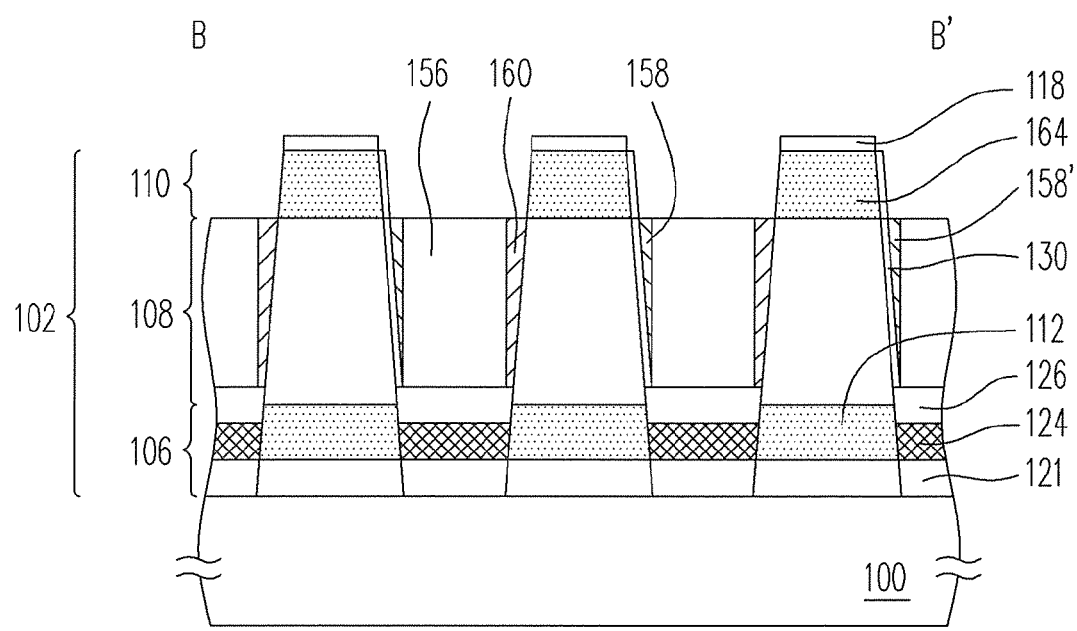

Next, referring to FIG. 9, FIG. 9A and FIG. 9B, the patterned mask layer 150 and the patterned nitride layer 120 are removed. The method of removing the patterned mask layer 150 and the patterned nitride layer 120 can be wet etching.

Moreover, referring to FIG. 9 and FIG. 9B, the conductive layer 132 and the conductive layer 140 located at two sides of the upper parts 110 of the pillars 102 are removed, so as to form surrounding gate lines 158 and base lines 160. The surrounding gate lines 158 extend along the direction 114, and each of the surrounding gate line 158 is located on a sidewall at a side of the channel region 108 of the pillar 102. In FIG. 9, the surrounding gate line 158 wraps the sidewall of each of the pillar 102 in an opening-shape. In FIG. 9B, the surrounding gate line 158 functions as a surrounding gate 158' for the same column of the vertical transistors, and the surrounding gate 158' is located on the gate dielectric layer 130 of the channel region 108. The base lines 160 extend along the direction 114, and each of the base lines 160 is located on a sidewall at the other side of the channel region 108 of the pillar 102, and is electrically connected to the channel regions 108 of the same column of the pillars 102. Regarding a single pillar 102, the base line 160 directly corresponds to the opening part of the surrounding gate 158, and keeps a distance with the surrounding gate 158 to prevent mutual touching.

Now, in FIG. 9A, a part of the conductive layer 140 is removed to form a connecting lead 162, wherein the connecting lead 162 extends along the direction 116, and is electrically connected to the base line 160.

Next, doped regions 164 are formed in the upper parts 110 of the pillars 102 to serve as sources/drains. The method of forming the doped regions 164 can be ion implantation. A conductive type of the doped region 164 can be the same to that of the doped region 112.

According to the above embodiment, the vertical transistor array includes the substrate 100, the gate dielectric layer 130, the surrounding gate lines 158 and the base lines 160. The substrate 100 includes the pillars 102 protruding out of a surface of the substrate 100. Wherein, each of the pillars 102 includes the doped region 112, the channel region 108 and the doped region 164 from bottom to top, and the pillars 102 are arranged along the direction 114 and the direction 116. The surrounding gate lines 158 extend along the direction 114, and each of the surrounding gate lines 158 is disposed on a sidewall at one side of the channel region 108 of the pillar 102, and one end of the surrounding gate line 158 in the direction 114 is coupled to an external voltage. The base lines 160 extend along the direction 114, and each of the base lines 160 is disposed on a sidewall at the other side of the channel region 108 of the pillar 102 and is electrically connected to the channel regions 108 of the same column of the pillars 102, and the other ends of the base lines 160 in the direction 114 are mutually and electrically connected. The gate dielectric layer 130 is disposed between the surrounding gate lines 158 and the channel regions 108 of the pillars 102. Moreover, the vertical transistor array further includes bit lines 124 and a connecting lead 162. The bit lines 124 extend along the direction 116, and each of the bit lines 124 is electrically connected to the doped region 112 of the pillar 102. The connecting lead 162 extends along the direction 116, and is electrically connected to the base lines 160. Since materials, formation methods and functions of the elements within the vertical transistor array have been described in detail in the above embodiment, detailed descriptions thereof are not repeated.

In the following content, the vertical transistor of the present embodiment is described with reference of FIG. 9B.

Referring to FIG. 9B, the vertical transistor includes the substrate 100, the gate dielectric layer 130, the surrounding gate 158' and the base line 160. The substrate 100 includes the pillar 102 protruding out of a surface of the substrate 100. Wherein, the pillar 102 includes the doped region 112, the channel region 108 and the doped region 164 from bottom to top. The surrounding gate 158' is disposed on a sidewall at a side of the channel region 108. The base line 160 is disposed on a sidewall at the other side of the channel region 108, and is not contacted to the surrounding gate 158'. The gate dielectric layer 130 is disposed between the surrounding gate 158' and the channel region 108. Moreover, the vertical transistor further includes a bit line 124 disposed on the sidewall of the doped region 112. Since materials, formation methods and functions of the elements within the vertical transistor have been described in detail in the above embodiment, detailed descriptions thereof are not repeated.

According to the vertical transistor array and the vertical transistor fabricated based on the aforementioned embodiment, since one side the vertical transistor in the vertical transistor array has the base line 160, it can be used as a ground line, so that a floating body effect can be effectively prevented, and therefore reliability and stability of the device can be improved, and current leakage can be prevented.

Moreover, if the pillar 102 in the vertical transistor is a square pillar, the surrounding gate 158' is a three-side gate structure that surrounds three sides of the pillar 102, so that the vertical transistor may have a better channel control capability.

In addition, if the bit lines 124 in the vertical transistor array are embedded bit lines, a size of the device can be further reduced.

In summary, the present embodiment has at least the following advantages:

1. The vertical transistor in the vertical transistor array based on the aforementioned embodiment can effectively prevent a floating body effect, and therefore reliability and stability of the device can be improved, and current leakage can be prevented.

2. The vertical transistor fabricated based on the aforementioned embodiment has a surrounding gate structure, so that the vertical transistor may have a better channel control capability.

3. If the bit lines in the vertical transistor array based on the aforementioned embodiment are embedded bit lines, a size of the device can be further reduced.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method for fabricating a vertical transistor, comprising:
   providing a substrate, a pillar protruding out of a surface of the substrate being formed on the substrate, wherein the pillar comprises a lower part, a channel region, and an upper part from bottom to top, and the lower part has a first doped region;
   forming a gate dielectric layer on a sidewall at one side of the pillar;
   forming a surrounding gate on the gate dielectric layer located on the channel region, and forming a base line electrically connected to the channel region on a sidewall at the other side of the pillar; and
   forming a second doped region in the upper part of the pillar.

2. The method for fabricating the vertical transistor as claimed in claim 1, wherein after the first doped region is formed, and before the gate dielectric layer is formed, the method further comprises forming a bit line on a sidewall of the first doped region.

3. The method for fabricating the vertical transistor as claimed in claim 2, wherein a method of forming the bit line comprises:
   forming a first dielectric layer on the substrate at two sides of the pillar;
   conformally forming a first conductive layer on the substrate, wherein the first conductive layer covers the pillar and the first dielectric layer; and
   performing an etching back process to the first conductive layer.

4. The method for fabricating the vertical transistor as claimed in claim 3, wherein a method of forming the gate dielectric layer comprises:
   forming a second dielectric layer on the substrate, wherein the second dielectric layer covers the pillar;
   removing a part of the second dielectric layer to expose the pillar;
   forming a first patterned mask layer on the second dielectric layer, wherein the first patterned mask layer is located on a part of the second dielectric layer closed to the other side of the pillar;
   using the first patterned mask layer as a mask to remove a part of the second dielectric layer, so as to form a first opening, wherein the first opening exposes the channel region and a sidewall at one side of the upper part;
   removing the first patterned mask layer; and
   forming the gate dielectric layer on the channel region and the sidewall at one side of the upper part.

5. The method for fabricating the vertical transistor as claimed in claim 4, wherein a method of forming the surrounding gate and the base line comprises:
   forming a second conductive layer in the first opening to fill the first opening;
   removing a part of the second dielectric layer closed to the other side of the pillar to form a second opening, wherein the second opening exposes the channel region and a sidewall at the other side of the upper part;
   forming a third conductive layer in the second opening to fill the second opening;
   forming a second patterned mask layer on the pillar, wherein two sides of the second patterned mask layer respectively cover a part of the second conductive layer and a part of the third conductive layer;
   removing the second conductive layer and the third conductive layer not covered by the second patterned mask layer;
   removing the second patterned mask layer; and
   removing the second conductive layer and the third conductive layer located at two sides of the upper part of the pillar.

* * * * *